United States Patent [19]

Molaire et al.

[11] Patent Number: 4,650,734

[45] Date of Patent: Mar. 17, 1987

[54] COLOR FILTER ELEMENTS AND ELECTROPHOTOGRAPHIC METHOD OF MAKING SAME

[75] Inventors: Michel F. Molaire; Michael Scozzafava, both of Rochester; William C. McColgin, Pittsford, all of N.Y.

[73] Assignee: Eastman Kodak Company, Rochester, N.Y.

[21] Appl. No.: 871,748

[22] Filed: Jun. 9, 1986

[51] Int. Cl.[4] ........................ G03G 13/01; G03F 5/00

[52] U.S. Cl. ........................................ 430/7; 430/11; 430/15; 430/17; 430/18; 430/31

[58] Field of Search .................. 430/7, 11, 15, 17, 18, 430/31

[56] References Cited

U.S. PATENT DOCUMENTS 4,236,098 11/1980 Horak et al. ........................ 313/371

*Primary Examiner*—J. David Welsh

*Attorney, Agent, or Firm*—John R. Everett

[57] ABSTRACT

A photographic method for making a color filter element, and the resulting color filter element is disclosed.

15 Claims, No Drawings

COLOR FILTER ELEMENTS AND ELECTROPHOTOGRAPHIC METHOD OF MAKING SAME

FIELD OF THE INVENTION

This invention relates to a method for making color filter elements and to color filter elements.

BACKGROUND OF THE INVENTION

Methods for producing multicolor filter elements are known in the art.

A typical method for forming a single layer multicolor filter element is described in U.S. Pat. No. 4,236,098. In this patent, the color filter array is formed in a dye mordant layer. Dyes are imbibed from a solution into the mordant layer through window patterns that were formed using photoresist techniques. While this process results in filter elements having excellent properties, the problem is that the method involves repeated application, exposure and removal of photoresist. In general such methods employing photoresists require up to eight steps to form a single color array and up to twenty-three steps to form three different color arrays.

SUMMARY OF THE INVENTION

The present invention provides a method of making a color filter element comprising the steps of:

(a) providing a photoelectrographic element comprising a conductive layer in electrical contact with an acid photogenerating layer which (1) is free of photopolymerizable materials and (2) comprises an electrically insulating binder and an acid photogenerator;

(b) carrying out the following steps (i) and (ii) at the same time or in any order;

(i) imagewise exposing the photoelectrographic layer through a first mask;

(ii) electrostatically charging the exposed layer to form a first electrostatic latent image;

(c) developing the latent image with charged toner particles; and (d) fusing the toner particles with heat thereby forming a single color filter array.

Steps (b), (c) and (d) are repeated as described above with as many different masks and different colored toners as desired to produce additional different color filter arrays.

The method of this invention is an improvement over the above prior art methods for making color filter elements. The present method involves only five steps to form an element comprising a single color filter array and only eleven steps to form an element comprising three different color arrays. Prior art methods generally required at least eight steps to make a one color array and twenty-two steps for a three color array.

The present invention also provides a novel color filter element comprising:

(a) a transparent conductive layer in electrical contact with (b) a photoelectrographic layer comprising an electrically insulating binder and an acid photogenerator; wherein the photoelectrographic layer bears (c) at least one color filter array comprising a fused toner particle having a single color.

This color filter element represents an improvement over prior art color filter elements in that there is no cross contamination between the various colors in the different arrays although each array is in the same plane. Apparently, the heat fusing step of this method of making color filter elements causes the photoelectrographic layer to revert to a nonconducting state. The toners forming the first and second color filter arrays are selected to be opaque to the exposing radiation. Thus, the first color filter array formed, masks the photoelectrographic layer from subsequent exposure-creating conductivity. This absence of conductivity in the area of the first color filter array prevents subsequent color filter arrays from forming in the areas of the photoelectrographic layer masked by the first color filter array. This same phenomenon operates after the second color filter array is formed. Because of this, an edge of a subsequent color filter element can be self-aligned to edges of existing filter elements without gaps or overlaps caused by alignment error in the exposure during fabrication. Thus, many critical alignment problems are eliminated.

In a preferred method and color filter element of this invention, the acid photogenerator is selected from the group consisting of aromatic onium salts, aryldiazonium salts, triarylselenonium salts and the 6-substituted-2,4-bis(trichloromethyl)-5-triazines.

DETAILS OF THE INVENTION

Applicants will now describe how to use the method of the invention in making color filter elements.

The photoelectrographic element used in the method of this invention is exposed with actinic radiation imagewise through a mask representing the first color filter array to be formed. By actinic radiation we mean electromagnetic radiation to which the acid photogenerator in the photoelectrographic layer is sensitive. That is, upon exposure to actinic radiation, the acid photogenerator will generate protons which cause the photoelectrographic layer to become more conductive in the exposed areas than in the unexposed areas of the layer.

After exposure as described above, the photoelectrographic layer is charged either positively or negatively.

As stated above, the exposure of the photoelectrographic layer causes the photoelectrographic layer to be more conductive in the exposed areas than in the nonexposed areas. This imagewise conductivity differential forms an electrostatic latent image. The latent image is developed by contacting the photoelectrographic layer with a charged toner composition of the type used in electrophotographic development operations. Such toner compositions are well known being described in numerous patents and other literature such as U.S. Pat. Nos. 2,296,691, 4,546,060; 4,076,857 and 3,893,935.

After the latent electrostatic image is developed, the toners are fused by heating, thus fixing the first color filter array to the photoelectrographic layer. This heating step also causes the layer to revert to its preexposure and precharged state. No differential conductivity is observed.

The foregoing description illustrates how the first color filter array is laid down on the photoelectrographic layer. Subsequent arrays of different colors are laid down in the same way.

Thus, a number of different color arrays can be formed on the photoelectrographic layer to produce a color filter element. In most applications such photoelectrographic layers will bear two, three, four or more different color arrays making up the final color filter element.

In the method described above the photoelectrographic element is exposed before the layer is electrostatically charged. It is clear however, that the layer could be electrostatically charged prior to exposure. Or exposure and electrostatically charging could occur simultaneously.

Moreover, the photoelectrographic layer can be developed with a charged toner having the same sign as the latent electrostatic image or with a charged toner having a different sign from the electrostatic toner. In one case, a positive image is formed, in the other case, a negative image is formed. In each case, one obtains a complete color filter element in which each color filter array is in the same plane.

The acid photogenerating layers are prepared as follows. The acid photogenerator is dissolved in a suitable solvent in the presence of an electrically insulating binder. Then a sensitizer, if desired, is dissolved in the resulting solution prior to coating on conducting support.

Solvents of choice for preparing coating compositions of the acid photogenerators include benzene, toluene, acetone, 2-butanone, chlorinated hydrocarbons (e.g. ethylene dichloride, trichloroethane, dichloromethane), ethers (e.g. tetrahydrofuran), or mixtures of these solvents.

Useful electrically insulating binders for the acid photogenerating layers include polycarbonates, polyesters, polyolefins, phenolic resins and the like. Desirably, the binders are film forming. Mixtures of such polymers can also be utilized. Such polymers are capable of supporting electric fields in excess of $6\times10^5$ V/cm and exhibit a low dark decay of electrical charge.

Preferred binders comprise styrenebutadiene copolymers; silicone resins; styrene-alkyd resins; soya-alkyd resins; poly(vinyl chloride); poly(vinylidene chloride); vinylidene chloride, acrylonitrile copolymers; poly(vinyl acetate); vinyl acetate, vinyl chloride copolymers; poly(vinyl acetals), such as poly(vinyl butyral); polyacrylic and methacrylic esters, such as poly(methyl methacrylate), poly(n-butyl methacrylate), poly(isobutyl methacrylate, etc.; polystyrene; nitrated polystyrene; poly(p-vinylphenol); polymethylstyrene; isobutylene polymers; polyesters, such as phenolformaldehyde resins; ketone resins; polyamide; polycarbonates; etc. Methods of making resins of this type have been described in the prior art, for example, styrene-alkyd resins can be prepared according to the method described in U.S. Pat. Nos. 2,361,019 and 2,258,423. Suitable resins of the type contemplated for use in electrographic acid photogenerating layers are sold under such tradenames as Vitel PE 101-X, Cymac, Piccopale 100, and Saran F-220. Other types of binders which can be used include such materials as paraffin, mineral waxes, etc.

The amount of optical or speed enhancing sensitizer which can be added to a particular acid generating composition to give optimum sensitization varies widely. The optimum amount will, of course, vary with the acid photogenerator used and the thickness of the coating, as well as with the particular sensitizer. In general, substantial speed gains and wavelength adjustments can be obtained where an appropriate sensitizer is added at a concentration in a range from about 0.0001 to 30 percent by weight based on the weight of the acid generating composition.

The acid photogenerating layers are coated on a conducting support in any well-known manner such as doctor-blade coating, swirling, dip-coating, and the like.

The acid photogenerating materials should be chosen so that at certain concentrations in the dry coated composition, the resulting layer has a relatively small dark decay before irradiation, but the dark decay level should increase by radiation exposure.

In preparing the coating composition, useful results were obtained where the acid photogenerator was present in an amount equal to at least about 1 weight percent of the coating composition on a dry basis. The upper limit of the amount of acid photogenerator is not critical as long as no deleterious effect on the initial dark decay of the film is encountered. A preferred weight range for the acid photogenerator in the coated and dried composition is from 10 weight percent to about 60 weight percent.

Coating thicknesses of the acid photogenerator layer can vary widely. Normally a wet coating in the range from about 0.1 μm to about 50 μm are useful.

Any compound capable of generating an acid upon exposure will be useful herein. Useful aromatic onium salt acid photogenerators are disclosed in U.S. Pat. Nos. 4,081,276; 4,529,490; 4,216,288; 4,058,401; 3,981,897; and 2,807,648. Such aromatic onium salts include Group Va, Group VIa and Group VIIa elements. The ability of triarylselenonium salts, aryldiazonium salts and triarylsulfonium salts to produce protons upon exposure to light is also described in detail in "UV Curing, Science and Technology", Technology Marketing Corporation, Publishing Division, 1978.

A representative portion of the useful aryl iodonium salts are the following:

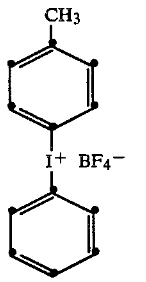

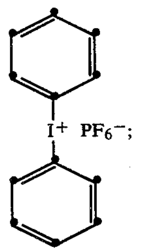

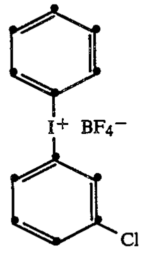

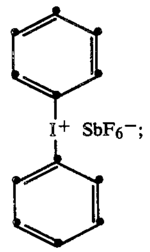

-continued
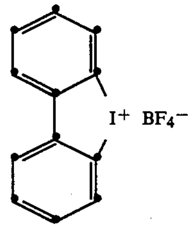
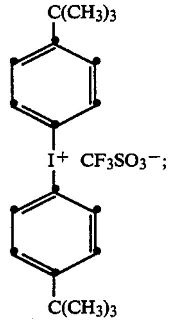
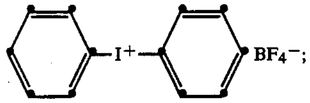
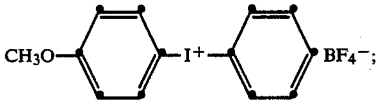
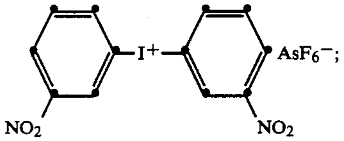
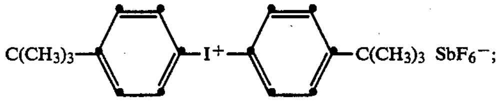
and
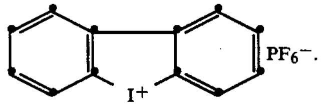
Representative useful Group Va onium salts are:
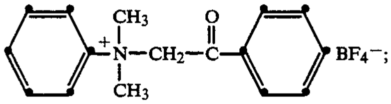
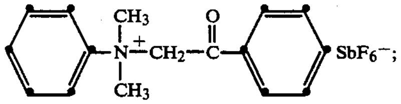
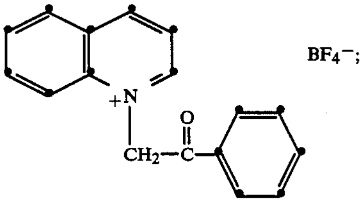
-continued
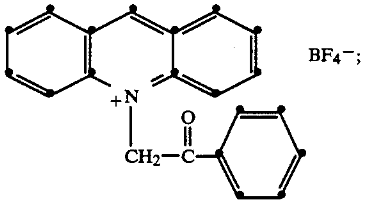
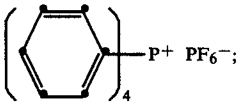
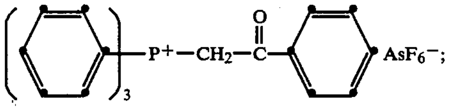
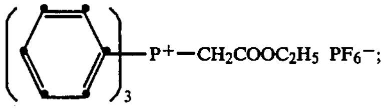
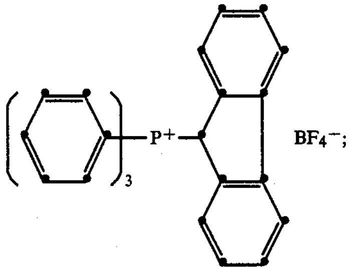
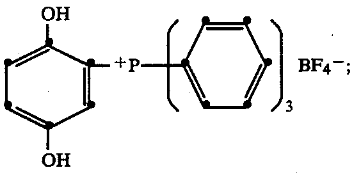
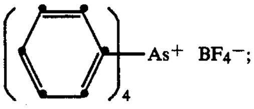
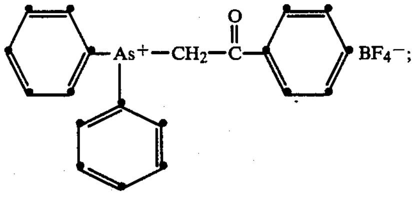
and
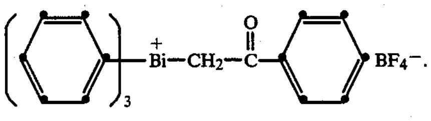
A representative portion of useful Group VIa onium salts, including sulfonium salts, are:

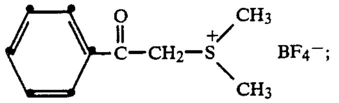
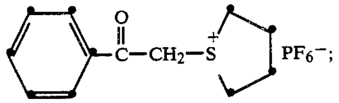
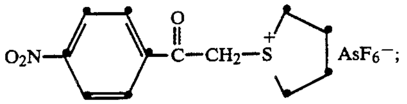
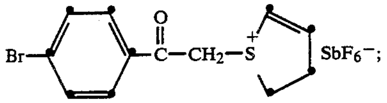
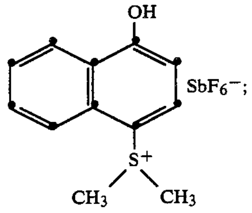
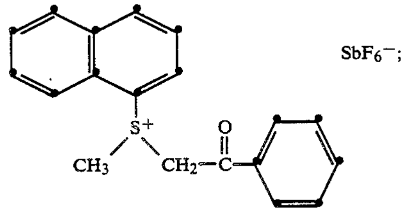
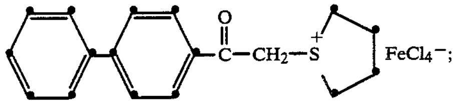
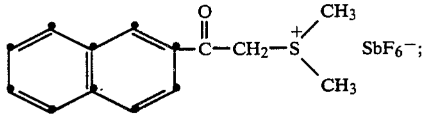
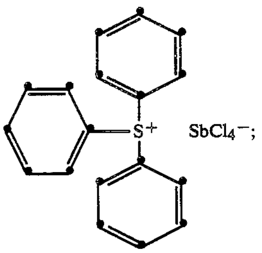
-continued
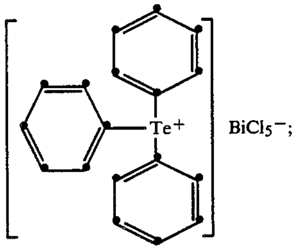
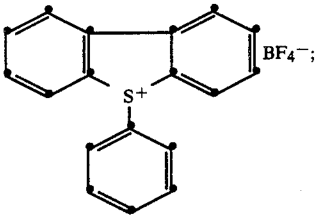
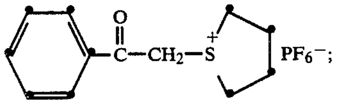
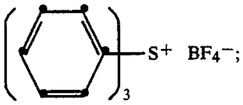
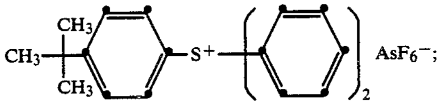
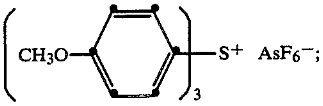
and
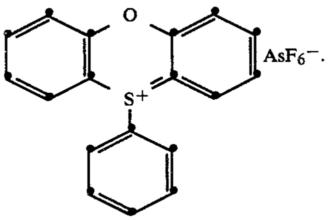
Other salts from which acid photogenerators may be selected from are:
1. Triarylselenium salts such as disclosed in Belgian Pat. Nos. 826,670 and 833,472. The following salts are representative:
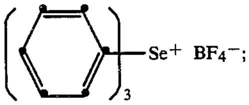

-continued

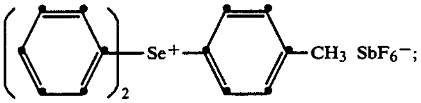

and

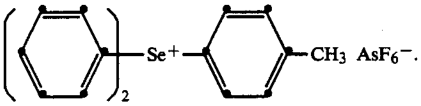

2. Aryldiazonium salts such as disclosed in U.S. Pat. Nos. 3,205,157; 3,826,650; 3,711,390; 3,816,281; 3,817,845 and 3,829,369. The following salts are representative:

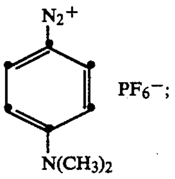

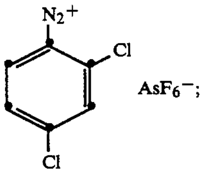

and

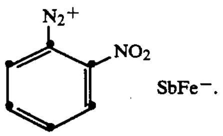

3. 6-Substituted-2,4-bis(trichloromethyl)-5-triazines such as disclosed in British Patent 1,388,492. The following are representative:

| | R |
|---|---|
| 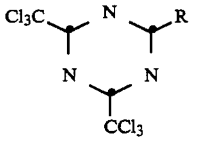 | 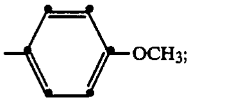 |
| | 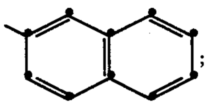 |
| | 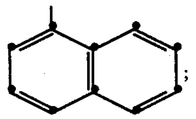 |
| | and |

-continued

| R |
|---|
| 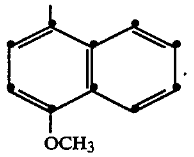 |

Another especially useful group of acid photogenerators include an ionic polymer comprising pendant ionic groups and an aromatic onium acid photogenerator counterion. Examples of useful polymers include:

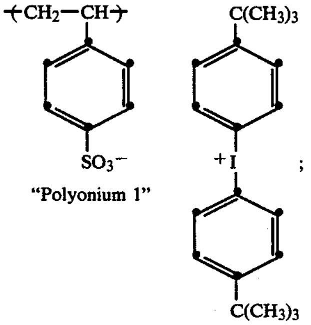

"Polyonium 1"

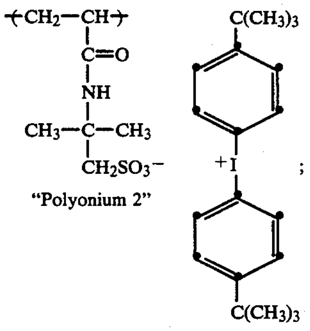

"Polyonium 2"

and

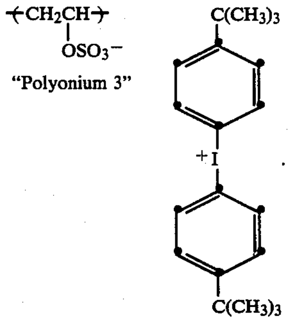

"Polyonium 3"

These polymers are made by simply exchanging ions between a commercially purchased or other anionic polymer salt and a simple nonpolymeric onium salt in aqueous solution. For example, a polymeric sulfonate salt will readily exchange anions in water with a diaryliodonium hydrogen sulfate. The reaction is driven to completion by precipitation of the new diaryliodonium polymeric sulfonate salt.

Alternatively, the ion exchange could be performed on an anionic monomer and the monomer, with any desirable comonomers, polymerized by conventional polymerization techniques.

A specific preparation follows.

Preparation of Polyonium 1

In a one liter beaker, 0.023 gm (0.00690 mole) of di-(4-t-butylphenyl)iodonium hydrogen sulfate was dissolved in about 300 ml of water. To the stirred solution in the beaker, was added dropwise 1.09 gm (0.00575 mole) of preformed poly(sodium p-styrenesulfonate) dissolved in about 200 ml of water. A precipitate of polyonium started to form on mixing. After complete addition, the precipitate was filtered, redissolved in dichloromethane, washed twice with water and reprecipitated into a large volume of heptane. The polymer was then filtered and dried at 100° C. for ten minutes.

Such polymers should comprise sufficient acid photogenerator groups to achieve the differential dark decay for imaging purposes. In general, such polymers comprise from 1 to 100 mole percent of acid generating groups. Ionic polymers from which the polyoniums of the present invention can be made are disclosed in U.S. Pat. Nos. 3,042,221; 3,506,707; 3,547,899; 3,411,911; 3,062,674 and 3,220,844.

The iodonium salt acid photogenerators may be sensitized by ketones such as xanthones, indandiones, indanones, thioxanthones, acetophenones, benzophenones or other aromatic compounds such as anthracenes diethoxyanthracenes, perylenes, phenothiazines, etc.

Triarylsulfonium salt acid generators may be sensitized by aromatic hydrocarbons, anthracenes, perylenes, pyrenes and phenothiazines.

Useful transparent conducting layers include any of the transparent electrically conducting layers used in electrophotography. These include, for example, certain transparent polyesters having a thin electroconductive layer (e.g. cuprous iodide, nickel, chromium, etc.) coated thereon.

The following examples further illustrate how to use the method of the present invention to make color filter elements bearing a plurality of different color filter arrays.

EXAMPLE 1

Three-Color Color Filter Element Fabrication

The formulation described in Table I, infra., was spin coated at 3000 rpm on a 50.8×50.8 mm polyester substrate upon which was previously coated a thin transparent layer of conductive CuI. The sample was dried for 20 minutes at about 100° C. in an oven, then exposed through a line mask (clear area approximately 0.5 mm) to the energy of a 200 watt Hg lamp for 40 seconds. The exposed sample was corona charged positively for 60 seconds and dipped into a positive liquid toner of magenta coloration for 60 seconds. The magenta toners deposited on the light exposed areas of the sample. After washing in heptane, the sample was baked for about 10 minutes at about 100° C. to produce a magenta color filter array.

The film was exposed again using the same conditions as before except that the previously exposed areas were protected with the black area of the line mask. The sample was then corona charged positively for 60 seconds before toning with a cyan toner. This time the cyan tone only went in the freshly exposed areas to give cyan and magenta color filter arrays. After baking for 10 minutes at approximately 100° C., the sample was given a blanket exposure for 40 seconds, positively charged for 60 seconds and toned with a black toner for 60 seconds. The black toner deposited only in the blank area to yield magenta, cyan and black color filter arrays. The thus produced color filter element comprised magenta, cyan and black color filter arrays.

TABLE I

| Photoelectrographic Formulation | |
|---|---|
| Poly(methyl methacrylate) | 1.3 gm |
| Di(4-t-butylphenylene)iodonium hexafluorophosphate | 0.2 gm |
| Surfactant FC 430 ® from 3M Co. | 3 drops |
| Dichloroethane (DCE) | 7 gm |

EXAMPLE 2

Two-Color Microfilter Element Fabrication

The formulation in Table II, infra., was spin-coated on a semi-transparent aluminum-coated 101.6 mm glass disk, at 2000 rpm. The wafer was dried at 100° C. for 15 minutes in an air circulating oven. The wafer was exposed through a chrome mask (approximately 10$\mu$ lines) for 90 seconds in a Mask Aligner having an intensity of 25 mW/cm$^2$.

The exposed sample was corona charged positively for 60 seconds and dipped into a positive liquid toner with submicron particles of black coloration for 60 seconds. The sample was rinsed in fresh heptane twice and baked for 15 minutes in an air circulating oven at 100° C.

The wafer was then exposed again with another chrome mask for 90 seconds in the Mask Aligner having an intensity of 25 mW/cm$^2$. Corona positive charging was repeated for 60 seconds, followed by toning in a submicron positive liquid toner of red coloration. After baking for 15 minutes at 100° C., microscopy revealed red and black stripes of good resolution along with clear stripes. This example clearly shows that a three-color filter array of good resolution can be made by this method.

TABLE II

| Photoelectrographic Formulation | |
|---|---|
| Poly(methyl methacrylate) | 44 gm |
| Di(4-t-butylphenyl)iodonium hexafluorophosphate | 15.6 gm |
| DCE (dichloroethane) | 280 gm |
| FC 430 ®, (Surfactant from 3M Co.) | 10 drops |

The invention has been described in detail with particular reference to preferred embodiments thereof, but it will be understood that variations and modifications can be effected within the spirit and scope of the invention.

We claim:

1. A color filter element comprising:

(a) a transparent conductive layer in electrical contact with (b) a photoelectrographic layer comprising an electrically insulating binder and acid photogenerator; wherein the photoelectrographic layer bears (c) at least one color filter array comprising a plurality of fused toner particles of a single color.

2. The element of claim 1 wherein the photoelectrographic layer bears at least two different color filter arrays in the same plane.

3. The element of claim 1 wherein the acid photogenerator is selected from the group consisting of aromatic onium salts and 6-substituted-2,4-bis(trichloromethyl)-5-triazines.

4. The element of claim 1 wherein the acid photogenerator is selected from the group consisting of aryliodonium salts and triarylsulfonium salts.

5. The element of claim 1 wherein the acid photogenerator is a polymer comprising appended anionic groups having an aromatic onium acid photogenerator positive counter ion.

6. The element of claim 5 wherein the acid photogenerator counter ion is selected from the group consisting of arylhalonium and triarylsulfonium positive ions.

7. The element of claim 6 wherein the acid photogenerator counter ion is an aryliodonium positive ion.

8. The element of claim 6 wherein the acid photogenerator counter ion is di-(4-t-butylphenyl)iodonium.

9. The element of claim 1 wherein the acid photogenerator is selected from the group consisting of

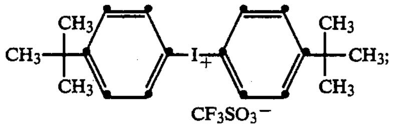

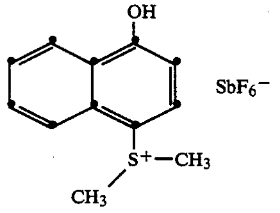

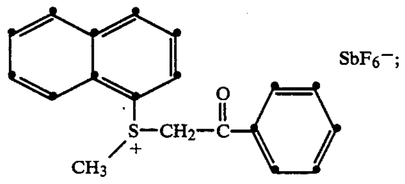

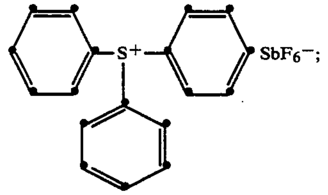

-continued

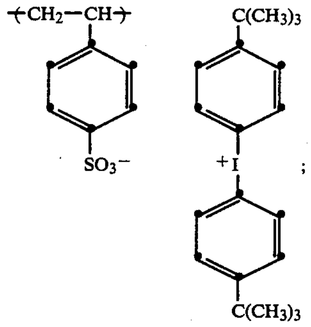

;

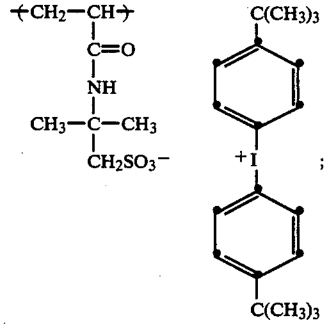

; and

10. The element of claim 1, 2, 3, 4, 5, 6, 7, 8 or 9 in which the acid photogenerating layer also comprises a spectral sensitizer.

11. The element of claim 1, 2, 3, 4, 5, 6, 7, 8 or 9 in which the acid photogenerating layer comprises at least one weight percent of the acid photogenerator.

12. A method of making a color filter element comprising the steps of:

(a) providing a photoelectrographic element comprising a conductive layer in electrical contact with an acid photogenerating layer (1) which is free of photopolymerizable materials and (2) comprises an electrically insulating binder and an acid photogenerator;

(b) carrying out the following steps (i) and (ii) at the same time or in any order;

(i) imagewise exposing the photoelectrographic layer through a first mask;

(ii) electrostatically charging the exposed layer to form a first electrostatic latent image;

(c) developing the latent image with charged toner particles of a single color; and (d) fusing the toner particles with heat thereby forming a single color filter array.

13. The method of claim 12 wherein a second color array of a single color is formed by repeating steps (b), (c) and (d) of claim 12 using a second mask and a toner of a different color.

14. The method of claim 13 wherein a third color pattern is formed by repeating steps (b), (c) and (d) of claim 13 using a third mask and a toner of a third color.

15. The method of claim 12 wherein the acid photogenerator is selected from the acid photogenerators described in claim 3, 4, 5, 6, 7, 8 or 9.

* * * * *